United States Patent
Tang et al.

(10) Patent No.: US 8,379,356 B2
(45) Date of Patent: Feb. 19, 2013

(54) OVERVOLTAGE PROTECTION DEVICE AND ITS FABRICATION

(75) Inventors: Jing-Rong Tang, Taipei City (TW); Wen-Hsin Lin, Taipei City (TW); Szu-Lung Sun, Hsinchu City (TW)

(73) Assignee: Holy Stone Enterprise Co., Ltd., Taipei (TW)

( * ) Notice: Subject to any disclaimer, the term of this patent is extended or adjusted under 35 U.S.C. 154(b) by 166 days.

(21) Appl. No.: 13/039,782

(22) Filed: Mar. 3, 2011

(65) Prior Publication Data
US 2012/0224290 A1    Sep. 6, 2012

(51) Int. Cl.
*H02H 3/20* (2006.01)
*H02H 9/04* (2006.01)

(52) U.S. Cl. .................... 361/91.1; 361/91.5
(58) Field of Classification Search ............ 361/91.1
See application file for complete search history.

(56) References Cited

U.S. PATENT DOCUMENTS

| | | | |
|---|---|---|---|
| 6,285,535 B1* | 9/2001 | Nakamura | 361/56 |
| 2010/0182724 A1* | 7/2010 | Ito et al. | 361/56 |
| 2010/0252912 A1* | 10/2010 | Murayama | 257/603 |
| 2012/0091504 A1* | 4/2012 | Davis et al. | 257/146 |

* cited by examiner

*Primary Examiner* — Dharti Patel
(74) *Attorney, Agent, or Firm* — Muncy, Geissler, Olds & Lowe, PLLC

(57) ABSTRACT

An overvoltage protection device made by: employing a machining technique to make a through hole through opposing top and bottom walls of a substrate, and then filling an overvoltage protection material in the through hole of the substrate, and then curing the overvoltage protection material, and then coating a flat electrode on each of the top and bottom walls of the substrate over and in connection with top and bottom sides of the overvoltage protection material.

14 Claims, 3 Drawing Sheets

OVERVOLTAGE PROTECTION DEVICE AND ITS FABRICATION

BACKGROUND OF THE INVENTION

1. Field of the Invention

The present invention relates to overvoltage protection technology and more particularly, to an overvoltage protection device made by: making at least one through hole on a substrate, and then filling an overvoltage protection material in each through hole, and then employing a metallization technique to form a flat electrode on the top and bottom sides of the overvoltage protection material in each through hole.

2. Description of the Related Art

Regular electronic products and their related peripheral devices use many active and passive components. An active (microprocessor or chip) can perform operation and data processing independently. A passive component does not require electrical power to operate and is not capable of power gain. Capacitor, resistor and inductor are the three major passive components intensively used in information, communication and consumer electronics as well as many other industrial products to constitute an electronic control loop.

However, abnormal high voltage and static electricity are harmful to electronic devices and difficult to be eliminated. When an electronic product receives an abnormal high voltage or electrostatic discharge, an unstable condition, such as function failure, may occur. When this problem occurs, the user may have to reset the system, or the internal components may be damaged by the abnormal high voltage or electrostatic discharge. To avoid this problem, an overvoltage protection device may be used. An overvoltage protection device is a passive component intensively used in cell phone, motherboard, notebook computer, digital camera and etc. to protect the internal electronic components of the electronic product against any abnormal high voltage and electrostatic discharge, for example, to protect the LED of a backlight module of an electronic product against abnormal high voltage and electrostatic discharge.

Further, in a conventional LED device, LED chips are installed in a cooling substrate, and gold or aluminum wires are bonded to electrically connect the electrodes of the LED chips to positive and negative electrodes of the cooling substrate, and overvoltage protection device, for example, Zener diode are bonded to the cooling substrate by means of SMT or flip-chip technology. Alternatively, low-temperature cofired ceramics may be directly formed in the surface of the cooling substrate, and then gold or aluminum wires are bonded to electrically couple the overvoltage devices to positive and negative electrodes of the cooling substrate for enabling the overvoltage protection devices to protect the LED chips against abnormal high voltage and electrostatic discharge.

The aforesaid method of coupling Zener diodes in parallel to LED chips to form an overvoltage protection loop can effectively protect the LED chips against abnormal high voltage and electrostatic discharge. However a LED product of this design does not allow positioning of the optical axis at the center. A certain area of the cooling substrate must be left for the installation of the overvoltage protection devices, shortening the effective reflective area, lowering the light extraction and heat dissipation efficiency and complicating optical axis design. If aluminum nitride, high purity aluminum oxide or other high conductivity material is used, or a crystal-pulling technique is employed, a vacuum or reduction sintering process is necessary to sinter the material at a high temperature (1600~1700° C.). It is difficult and expensive to make an embedded overvoltage protective device under this high temperature condition.

Therefore, there is a strong demand to provide an overvoltage protection device fabrication method for making an overvoltage protection device for LED product by embedding a high thermal conductivity type overvoltage protection material in a cooling substrate that effectively protects the LED chips against overvoltage and electrostatic discharge, keeps the surface of the substrate smooth, allows free arrangement of the LED chips to keep the optical axis at the center of the substrate, and improves light extraction and heat dissipation efficiency.

SUMMARY OF THE INVENTION

The present invention has been accomplished under the circumstances in view. It is the main object of the present invention to provide an overvoltage protection device for LED product and its fabrication method, which effectively protects LED chips against overvoltage and electrostatic discharge, keeps the surface of the substrate smooth, allows free arrangement of LED chips to keep the optical axis at the center of the substrate, and improves light extraction and heat dissipation efficiency.

To achieve this and other objects of the present invention, an overvoltage protection device comprises a substrate having at least one through hole cut through opposing top and bottom walls thereof, an overvoltage protection material embedded in each through hole, and a plurality of flat electrodes respectively coated on top and bottom walls of the substrate over and in connection with top and bottom sides of the overvoltage protection material in each through hole.

To achieve this and other objects of the present invention, an overvoltage protection device fabrication method includes the steps of (a) preparing a substrate and then employ a machining technique to make at least one through hole through opposing top and bottom walls of the substrate, (b) preparing an overvoltage protection material in the form of a paste, (c) employing a dispensing, molding or screen-printing technique to fill the overvoltage protection material in each through hole of the substrate and then employing a firing technique to cure the applied overvoltage protection material, and (d) employing an electroplating, vacuum coating or screen-printing technique to form a flat electrode on each of the top and bottom walls of the substrate over and in connection with the top and bottom sides of the overvoltage protection material in each through hole.

BRIEF DESCRIPTION OF THE DRAWINGS

Other and further advantages and features of the present invention will be fully understood by reference to the following specification in conjunction with the accompanying drawings.

DETAILED DESCRIPTION OF THE PREFERRED EMBODIMENT

Figure 1:
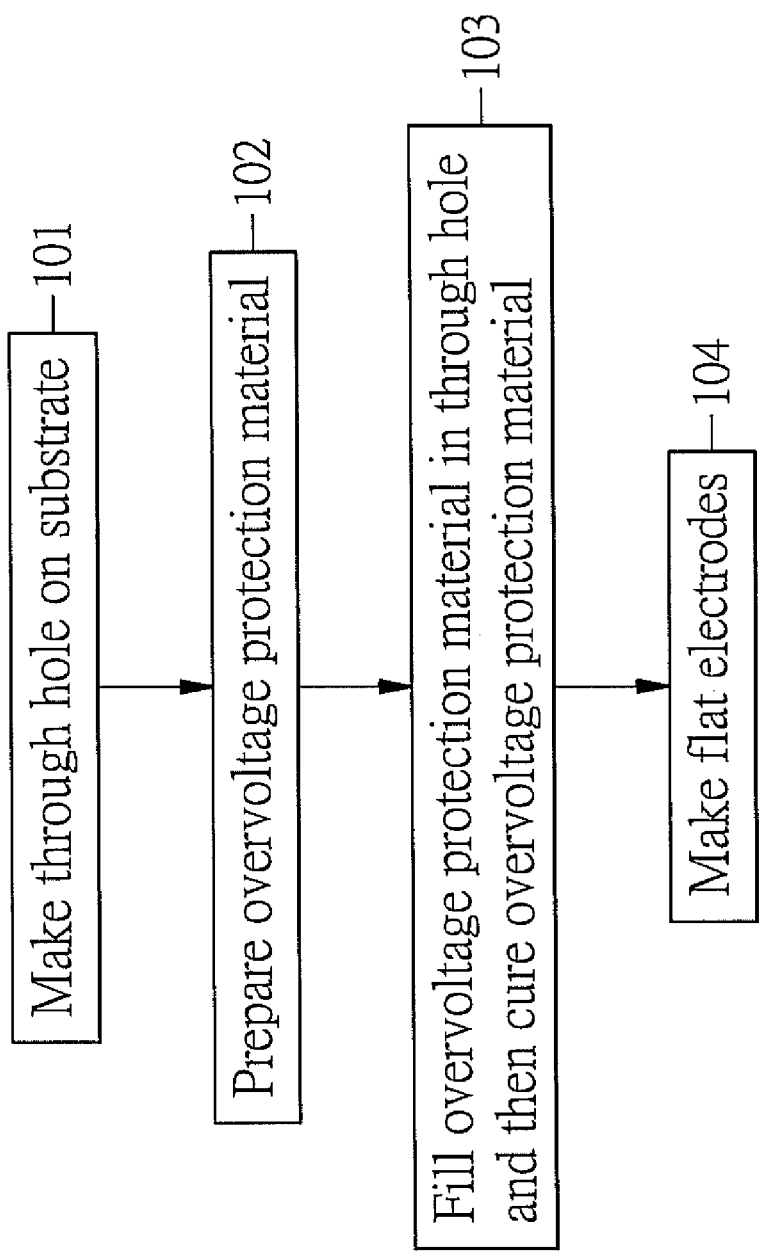
FIG. 1 is an overvoltage protection device manufacturing flow chart according to the present invention.
Figure 2:
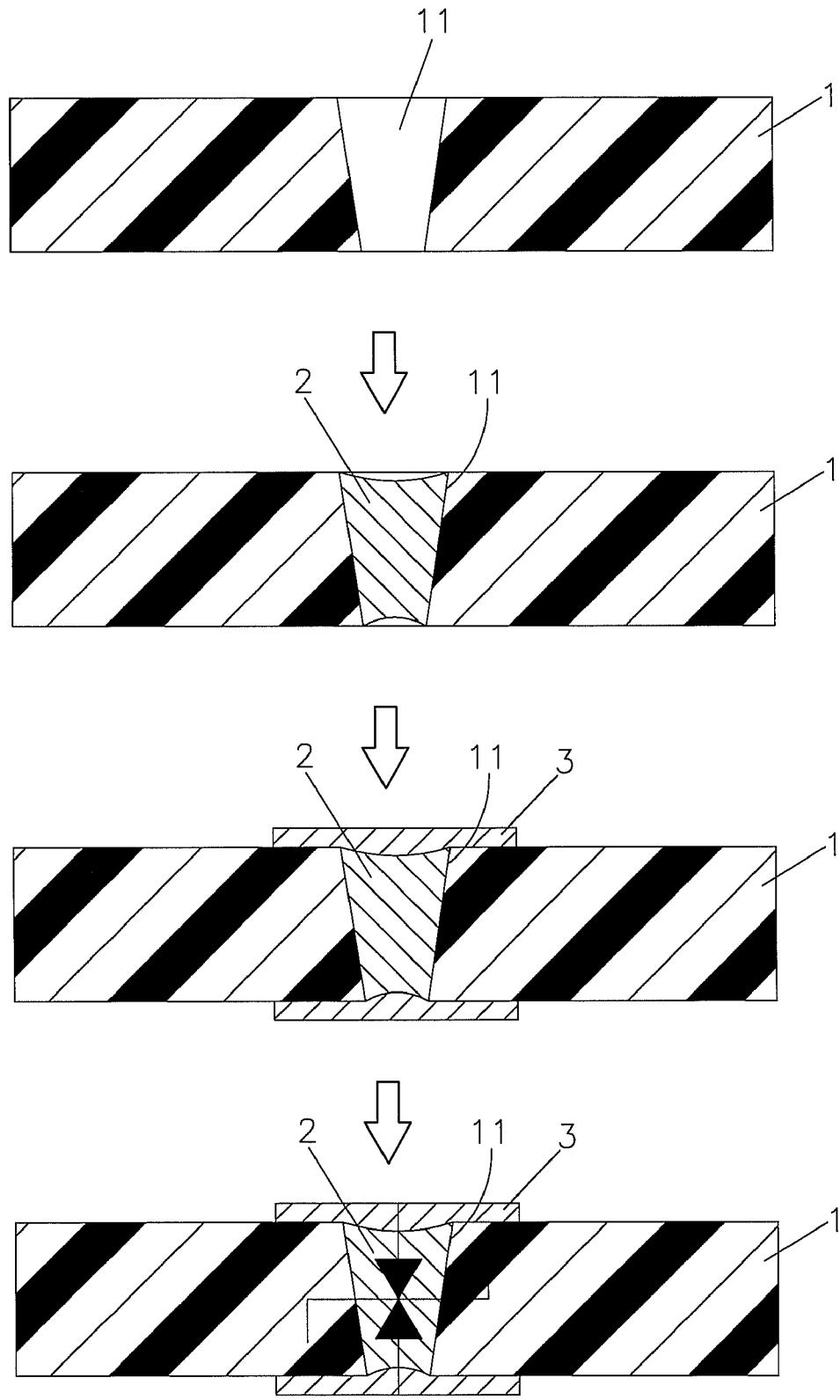
FIG. 2 is a series of schematic drawings illustrating the formation of an overvoltage protection device during the manufacturing process in accordance with the present invention.
Figure 3:
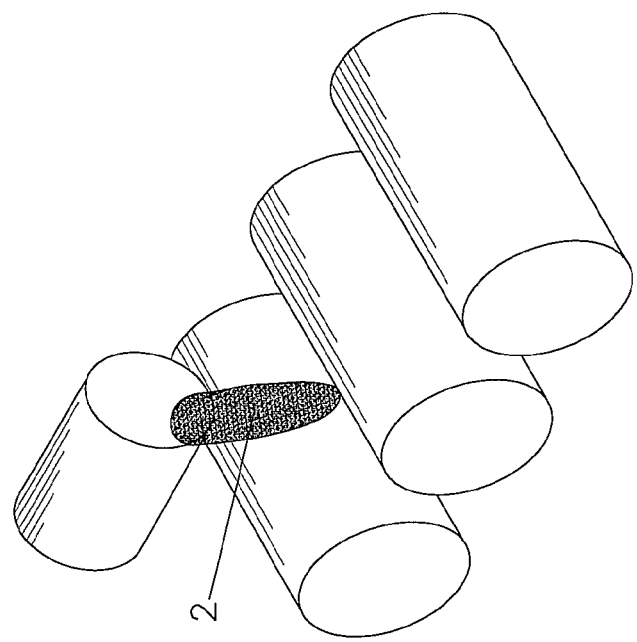
FIG. 3 is a schematic drawing illustrating the structure of the material of the overvoltage protection device in accordance with the present invention.
Figure 3:

Referring to FIGS. 1~3, an overvoltage protection device in accordance with the present invention is shown comprising a substrate 1 having at least one through hole 11 cut through opposing top and bottom walls thereof, an overvoltage protection material 2 embedded in each through hole 11, and a plurality of flat electrodes 3 respectively coated on the top and bottom walls of the substrate 1 over and in connection with the top and bottom sides of the overvoltage protection material 2 in each through hole 11.

The fabrication of the aforesaid overvoltage protection device includes the steps as follows:

(101) Prepare a substrate 1 and then employ a machining technique to make at least one through hole 11 through opposing top and bottom walls of the substrate 1.

(102) Prepare an overvoltage protection material 2 in the form of a paste.

(103) Employ a dispensing, molding or screen-printing technique to fill the prepared overvoltage protection material 2 in each through hole 11 of the substrate 1, and then employ a firing technique to cure the applied overvoltage protection material 2.

(104) Employ an electroplating, vacuum coating or screen-printing technique to form a flat electrode 3 on each of the top and bottom walls of the substrate 1 over and in connection with the top and bottom sides of the overvoltage protection material 2 in each through hole 11.

During the fabrication of the overvoltage protection device, the first step is to make at least one through hole 11 through opposing top and bottom walls of the substrate 1 subject to the application of a laser emitter, water jet cutter, drill, milling machine or any other machining apparatus. Thereafter, blend selected materials into a paste-like overvoltage protection material 2, and then employ a dispensing, molding or screen-printing technique to fill the blended paste-like overvoltage protection material 2 into each through hole 11 and then employ a firing technique to cure the applied overvoltage protection material 2 in each through hole 11, integrating the overvoltage protection material 2 with the substrate 1. Thereafter, employ an electroplating, vacuum coating, chemical vapor deposition, sputter deposition or screen-printing techniques to deposit or print a conducting material (such as Cu, Ag, Au, Ni, Pb, Sn or Pt+Au) on the top and bottom walls of the substrate 1, thereby forming a flat electrode 3 at each of the top and bottom sides of the overvoltage protection material 2 in each through hole 11. Thereafter, test the product subject to predetermined specifications. By means of performing the aforesaid manufacturing process in conjunction with conventional circuit layout techniques, the invention is practical for mass production of high quality overvoltage protection devices.

Further, the aforesaid substrate 1 can be made by the manufacturer or obtained from the market. Unlike a thin-sheet LTCC (Low-Temperature Co-fired Ceramics) material before sintering, the substrate 1 is a hard substrate prepared from an organic, inorganic or metal material, such as ceramics, silicon, glass, glass fiber, polyester, phenolic molding compound (Bakelite) or aluminum. Each through hole 11 of the substrate 1 can be a straight hole, conical hole, tapered hole, or any other type of through hole. The prepared overvoltage protection material 2 is filled in each through hole 11 of the substrate 1, and then cured by means of heating, sintering. Thereafter, a metallization step is employed to form a flat electrode 3 on each of the top and bottom sides of the overvoltage protection material 2 in each through hole 11 of the substrate 1, forming an embedded substrate. When the voltage at the two flat electrodes 3 at the top and bottom sides of the overvoltage protection material 2 in each through hole 11 of the substrate 1 exceeds the breakdown voltage, the impedance will be transiently minimized to suppress transient surges and to absorb and discharge abnormal current, avoiding external photoelectric chips (for example, LED chips) at the circuits of the substrate 1 from bearing an abnormal high voltage or ESD (electrostatic discharge). Therefore, when used in a backlight module of an electronic apparatus, the invention achieves overvoltage protection and effectively reduces noise interference, assuring normal functioning of the light-emitting devices. When compared with conventional designs to form overvoltage protection devices in a cooling substrate by means of SMT, fip-chip packaging or LTCC techniques, the invention will not only protect photoelectric chips against overvoltage or ESD (electrostatic discharge) damage but also can keep the surface of the substrate 1 smooth, allowing free arrangement of external photoelectric chips, lowering the difficulty level of the design of optical axis of external photoelectric devices, and enabling the optical axis to be maintained at the center of the substrate 1 to improve light extraction and heat dissipation efficiency.

The overvoltage protection material 2 to be embedded in each through hole 11 of the substrate 1 can be selected from the following three series. The first series is prepared by: blending a semiconductor ceramic material (such as ZnO, $SrTiO_3$, Sic) with 0.1~30 wt. % other metal substances for calcination, and then grinding the calcinated semiconductor material thus obtained into powder and then mixing the powder thus obtained with glass powder and a resin to form a paste or fluid. In one example, 89.9 wt. % ZnO is blended with 0.97 wt. % MnO, 2.0 wt. % NiO, 0.97 wt. % CoO, 3.43 wt. % $Sb_2O_3$ and 2.73 wt. % $BiO_3$, and then the blended compound is sintered at 1250° C. and then the semiconductorized material is ground into zinc oxide powder. The breakdown voltage of the overvoltage protection material 2 is determined subject to the types and ratio of the added substances (such as MnO, NiO, CoO, $Sb_2O_3$ and $BiO_3$) and the sintering temperature employed. The zinc oxide powder thus obtained is then mixed with glass powder and a resin, forming a paste or fluid overvoltage protection material 2. The second series is prepared by: blending an elastic polymer with at least one metal powder (for example, blending 45 wt % silicon rubber with 55 wt % tungsten powder), or blending an elastic polymer with at least one metal powder and at least one nonconductor powder (for example, blending 45 wt % silicon rubber with 45 wt % tungsten powder and 10% aluminum oxide powder), or blending an elastic polymer with at least one metal powder and at least one semiconductor powder (for example, blending 45 wt % silicon rubber with 45 wt % tungsten powder and 10% silicon carbide powder), and then adding glass powder and a resin to the blended material to form a paste-like material. When this material is thermally cured, microcracks can be seen in the material due to the effects of different expansion coefficients. The metal micro particles in the elastic polymer shorten the conducting distance between the two flat electrodes 3 at the top and bottom sides of the overvoltage protection material 2, thereby lowering the breakdown voltage. The third series is prepared by: blending two materials having different expansion coefficients but about same specific gravity (such as aluminum oxide and glass) with at least one metal powder (such as Ag/Pb) to form a paste. In one example, blend 1~3 µm 30 wt % $Al_2O_3$ with 60 wt % ZnB glass and 10 wt % Ag/Pb, and then add a resin to the blended material to form a paste. When this material is thermally cured, microcracks can be seen in between aluminum oxide and glass, and the widely distributed metal micro particles can shorten the conducting distance between the two flat electrodes 3 at the top and bottom sides of the overvoltage protection material 2, thereby lowering the breakdown voltage. However, with respect to the type and ratio of the material used and the control of the sintering temperature for controlling the breakdown voltage and the process of ionizing surrounding air to release electrons for causing metal micro particles to form a bridge that conducts the two flat electrodes 3 when the two flat electrodes 3 receive a high voltage, all these details are of the known art and not within the scope of the invention. Therefore, no further detailed description in this regard is necessary.

In general, the invention provides an overvoltage protection device that comprises a substrate 1 having at least one through hole 11 cut through opposing top and bottom walls thereof, an overvoltage protection material 2 embedded in each through hole 11, and a plurality of flat electrodes 3 respectively coated on the top and bottom walls of the substrate 1 over and in connection with the top and bottom sides of the overvoltage protection material 2 in each through hole 11. When voltage received by the two flat electrodes 3 at the top and bottom sides of the overvoltage protection material 2 in each through hole 11 surpasses the breakdown voltage, the impedance of the overvoltage protection material 2 is transiently minimized to suppress transient surges and to absorb and discharge abnormal current, avoiding damage. Further, the design of the invention keeps the surface of the substrate 1 smooth, allowing free arrangement of external photoelectric chips, lowering the difficulty level of the design of optical axis of external photoelectric devices, and enabling the optical axis to be maintained at the center of the substrate 1 to improve light extraction and heat dissipation efficiency.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. An overvoltage protection device, comprising:
   a substrate having at least one through hole cut through opposing top and bottom walls thereof;
   an overvoltage protection material embedded in each said through hole; and
   a plurality of flat electrodes respectively coated on top and bottom walls of said substrate over and in connection with top and bottom sides of the overvoltage protection material in each said through hole.

2. The overvoltage protection device as claimed in claim 1, wherein said substrate is selected from an organic material.

3. The overvoltage protection device as claimed in claim 1, wherein said substrate is selected from an inorganic material.

4. The overvoltage protection device as claimed in claim 1, wherein said substrate is selected from a metal material.

5. The overvoltage protection device as claimed in claim 1, wherein each said through hole is a straight hole.

6. The overvoltage protection device as claimed in claim 1, wherein each said through hole is a tapered hole.

7. The overvoltage protection device as claimed in claim 1, wherein said overvoltage protection material comprises 70~99.9 wt % semiconductor ceramic material selected from the group of zinc oxide, strontium titanate and silicon carbide, and 0.1 wt~30 wt % dopant selected from the group of manganese oxide, nickel oxide, cobalt oxide, antimony oxide and bismuth oxide.

8. The overvoltage protection device as claimed in claim 1, wherein said overvoltage protection material comprises an elastic polymer doped with at least one metal powder.

9. The overvoltage protection device as claimed in claim 8, wherein said elastic polymer is silicon rubber; said at least one metal powder is tungsten powder.

10. The overvoltage protection device as claimed in claim 1, wherein said overvoltage protection material comprises an elastic polymer doped with at least one metal powder and at least one nonconductor powder.

11. The overvoltage protection device as claimed in claim 10, wherein said elastic polymer is silicon rubber; said at least one metal powder is tungsten powder; said at least one nonconductor powder is aluminum oxide.

12. The overvoltage protection device as claimed in claim 1, wherein said overvoltage protection material comprises an elastic polymer doped with at least one metal powder and at least one semiconductor powder.

13. The overvoltage protection device as claimed in claim 12, wherein said elastic polymer is silicon rubber; said at least one metal powder is tungsten powder; said at least one nonconductor powder is aluminum oxide; said at least one semiconductor powder is silicon carbide.

14. The overvoltage protection device as claimed in claim 1, wherein said overvoltage protection material comprises a predetermined ratio by weigh of aluminum oxide, glass and silver palladium.

* * * * *